(12) United States Patent
Zuo et al.

(10) Patent No.: US 10,871,689 B2
(45) Date of Patent: Dec. 22, 2020

(54) DISPLAY SUBSTRATE, DISPLAY PANEL, DISPLAY DEVICE AND BONDING METHOD

(71) Applicants: BOE Technology Group Co., Ltd., Beijing (CN); Chongqing BOE Optoelectronics Technology Co., Ltd., Chongqing (CN)

(72) Inventors: Cheng Zuo, Beijing (CN); Zhijun Xu, Beijing (CN); Kangpeng Dang, Beijing (CN)

(73) Assignees: BOE TECHNOLOGY GROUP CO., LTD., Beijing (CN); CHONGQING BOE OPTOELECTRONICS TECHNOLOGY CO., LTD., Chongqing (CN)

(*) Notice: Subject to any disclaimer, the term of this patent is extended or adjusted under 35 U.S.C. 154(b) by 3 days.

(21) Appl. No.: 15/757,066

(22) PCT Filed: Sep. 8, 2017

(86) PCT No.: PCT/CN2017/101034
§ 371 (c)(1),
(2) Date: Mar. 2, 2018

(87) PCT Pub. No.: WO2018/145453
PCT Pub. Date: Aug. 16, 2018

(65) Prior Publication Data
US 2020/0225545 A1 Jul. 16, 2020

(30) Foreign Application Priority Data
Feb. 8, 2017 (CN) .......................... 2017 1 0072174

(51) Int. Cl.
*G02F 1/1362* (2006.01)
*G02F 1/1333* (2006.01)
(Continued)

(52) U.S. Cl.
CPC .... *G02F 1/136286* (2013.01); *G02F 1/13338* (2013.01); *G02F 1/133305* (2013.01);
(Continued)

(58) Field of Classification Search
CPC ......... G02F 1/136286; G02F 1/133514; G02F 1/133305; G02F 1/13338; H01L 51/56;
(Continued)

(56) References Cited

U.S. PATENT DOCUMENTS

2014/0320764 A1 10/2014 Sah et al.
2015/0097810 A1 4/2015 Aoki et al.
(Continued)

FOREIGN PATENT DOCUMENTS

CN 101048022 A 10/2007
CN 101571635 A 11/2009
(Continued)

OTHER PUBLICATIONS

First Office Action of the prior Chinese application No. 201710072174.2 dated Feb. 27, 2019.
(Continued)

*Primary Examiner* — Karen Kusumakar
(74) *Attorney, Agent, or Firm* — Fay Sharpe LLP

(57) ABSTRACT

A display substrate, a display panel, a display device and a bonding method are provided. The display panel substrate includes: a transparent substrate comprising a display area and a bonding area located at the periphery of the display area. The bonding area is provided with a first bonding pad connected with a touch electrode, and a second bonding pad connected with a display electrode. One of the touch electrode and the display electrode is located in the display area, and the other electrode is located on another transparent substrate facing to the transparent substrate.

18 Claims, 4 Drawing Sheets

(51) Int. Cl.
*G02F 1/1335* (2006.01)
*G06F 1/16* (2006.01)
*G09F 9/30* (2006.01)
*H01L 27/32* (2006.01)
*H01L 51/00* (2006.01)
*H01L 51/56* (2006.01)

(52) U.S. Cl.
CPC ...... *G02F 1/133514* (2013.01); *G06F 1/1652* (2013.01); *G09F 9/301* (2013.01); *H01L 27/323* (2013.01); *H01L 27/3276* (2013.01); *H01L 51/0097* (2013.01); *H01L 51/56* (2013.01)

(58) Field of Classification Search
CPC ............... H01L 51/0097; H01L 27/323; H01L 27/3276; G09F 9/301; G06F 1/1652
See application file for complete search history.

(56) References Cited

U.S. PATENT DOCUMENTS

2015/0309637 A1* 10/2015 Sakuishi ............. H01L 51/0097
345/174

| | | | |
|---|---|---|---|
| 2015/0318339 A1 | | 11/2015 | Nakamura et al. |
| 2016/0062527 A1 | | 3/2016 | Lee |

FOREIGN PATENT DOCUMENTS

| | | |
|---|---|---|
| CN | 102819353 A | 12/2012 |
| CN | 104133580 A | 11/2014 |
| CN | 104253149 A | 12/2014 |
| CN | 105389039 A | 3/2016 |
| CN | 106229332 A | 12/2016 |
| CN | 106847827 A | 6/2017 |
| CN | 107275379 A | 10/2017 |
| EP | 2993561 A1 | 3/2016 |
| KR | 101597522 B1 | 2/2016 |
| TW | 201403403 A | 1/2014 |
| TW | 201441885 A | 11/2014 |
| TW | 201608438 A | 1/2016 |

OTHER PUBLICATIONS

International Search Report and Written Opinion for PCT Application PCT/CN2017/101034 dated Dec. 14, 2017.

* cited by examiner

DISPLAY SUBSTRATE, DISPLAY PANEL, DISPLAY DEVICE AND BONDING METHOD

This application is a 371 of PCT Application Serial No. PCT/CN2017/101034, filed on Sep. 8, 2017, which claims priority to Chinese Patent Application No. 201710072174.2, filed with the State Intellectual Property Office on Feb. 8, 2017 and titled "DISPLAY SUBSTRATE, DISPLAY PANEL, DISPLAY DEVICE AND BONDING METHOD," the entire contents of which are incorporated herein by reference.

TECHNICAL FIELD

The present disclosure relates to the field of display, and in particular to a display substrate, a display panel, a display device and a bonding method.

BACKGROUND

A display is a display device. Bonding refers to assembling of a panel and a flexible printed circuit (FPC), or the FPC and a printed circuit board (PCB) together and connecting them through an anisotropic conductive film (ACF) in accordance with a certain workflow in the production process of the display. Bonding is a process commonly used in a display module factory.

However, during bonding an on-cell touch display panel to the FPC, it needs bonding not only a bonding pad of a display electrode in the panel to the FPC, but also a bonding pad of a touch electrode in the panel to the FPC. A liquid crystal display panel is taken as an example. The display panel comprises a first transparent substrate and a second transparent substrates arranged at an interval. The first transparent substrate is located at the light-emitting side of the display panel. The second transparent substrate comprises a display area and a bonding area located at the periphery of the display area. The display area of the second transparent substrate is provided with a display electrode whose bonding pad is arranged in the bonding area of the second transparent substrate. The first transparent substrate comprises a display area and a bonding area located at the periphery of the display area. The display area of the first transparent substrate is provided with a touch electrode whose bonding pad is arranged in the bonding area of the first transparent substrate.

As the bonding pads of the display electrode and the touch electrode are located in different layers, two FPCs are required to be bonded to the bonding pads in different layers, respectively. Therefore, time and labor are wasted due to multiple times of bonding between the FPCs and the bonding pads. Moreover, the FPC bonded to the bonding pad of the touch electrode needs to cross the layer to be connected to the bonding pad and the PCB as the PCB and the second transparent substrate are generally arranged in the same layer, resulting in a lower mass production yield at present.

SUMMARY

The present disclosure provides a display substrate, a display panel, a display device and a bonding method, capable of solving the problem of a waste of time and labor because of multiple times of bonding and the lower mass production yield when bonding an on-cell touch display panel.

In a first aspect, the present disclosure provides a display substrate. The display substrate includes a transparent substrate that includes a display area and a bonding area located at the periphery of the display area.

The bonding area is provided with a first bonding pad connected with a touch electrode, and a second bonding pad connected with a display electrode. One of the touch electrode and the display electrode is located in the display area, and the other electrode is located on another transparent substrate facing to the transparent substrate.

In an implementation of the embodiments of the present disclosure, the display substrate is an array substrate and the display electrode is arranged on the transparent substrate.

In another implementation of the embodiments of the present disclosure, the display substrate is a color filter substrate. The touch electrode is arranged on the transparent substrate. A via hole is further formed in the color filter substrate, and is configured to connect the display electrode and the second bonding pad.

In a second aspect, the present disclosure provides a display panel. The display panel includes a first transparent substrate and a second transparent substrate facing to each other. The first transparent substrate is located at a light-emitting side of the display panel. Each of the first and second transparent substrates comprises a display area. A touch electrode is arranged in the display area of the first transparent substrate, and a display electrode is arranged in the display area of the second transparent substrate.

A via hole is formed in the first transparent substrate.

The first transparent substrate or the second transparent substrate is further provided with a bonding area located at the periphery of the display area. A first bonding pad connected to the touch electrode and a second bonding pad connected to the display electrode are arranged in the bonding area.

The via hole is configured to connect the second bonding pad and the display electrode when the bonding area is arranged on the first transparent substrate; or the via hole is configured to connect the first bonding pad and the touch electrode when the bonding area is arranged on the second transparent substrate.

In an implementation of the embodiments of the present disclosure, the display panel further includes: a printed circuit board and two flexible printed circuits. The first bonding pad is connected to the printed circuit board through one of the two flexible printed circuits; and the second bonding pad is connected to the printed circuit board through the other one of the two flexible printed circuits.

In another implementation of the embodiments of the present disclosure, a plurality of first bonding pads and a plurality of second bonding pads are arranged in the bonding area. The plurality of first bonding pads are connected to the printed circuit board through one flexible printed circuit; and the plurality of second bonding pads are connected to the printed circuit board through another flexible printed circuit.

In another implementation of the embodiments of the present disclosure, the distance between a side for the plurality of first bonding pads and a side for the plurality of second bonding pads that is adjacent to the side for the plurality of first bonding pads is greater than 100 millimeters when the plurality of first bonding pads and the plurality of second bonding pads are connected to the printed circuit board through two flexible printed circuits.

In another implementation of the embodiments of the present disclosure, the two flexible printed circuits and the printed circuit board are integrated into one piece.

In another implementation of the embodiments of the present disclosure, the display panel further includes: a printed circuit board and a flexible printed circuit. The first bonding pad and the second bonding pad are connected to the printed circuit board through the same flexible printed circuit.

In another implementation of the embodiments of the present disclosure, a plurality of first bonding pads and a plurality of second bonding pads are arranged in the bonding area. The plurality of first bonding pads and the plurality of second bonding pads are connected to the printed circuit board through the same flexible printed circuit.

In another implementation of the embodiments of the present disclosure, when the plurality of first bonding pads and the plurality of second bonding pads are connected to the printed circuit board through the same flexible printed circuit, the distance between a side for the plurality of first bonding pads and a side for the plurality of second bonding pads that is adjacent to the side for the plurality of first bonding pads may be greater than or equal to 100 micrometers and less than or equal to 100 millimeters.

In another implementation of the embodiments of the present disclosure, the same flexible printed circuit and the printed circuit board are integrated into one piece.

In another implementation of the embodiments of the present disclosure, the display panel is a display panel of a liquid crystal display (LCD) or an organic light-emitting diode (OLED) display.

In a third aspect, the present disclosure further provides a display device. The display device includes any display panel described in the second aspect.

In a fourth aspect, the present disclosure further provides a bonding method. The method includes:

providing a display panel that comprises a first transparent substrate and a second transparent substrate facing to each other, where the first transparent substrate is located at a light-emitting side of the display panel; each of the first and second transparent substrates comprises a display area; a touch electrode is arranged in the display area of the first transparent substrate and a display electrode is arranged in the display area of the second transparent substrate; the first transparent substrate or the second transparent substrate is further provided with a bonding area located at the periphery of the display area, where a first bonding pad and a second bonding pad are arranged in the bonding area; the first bonding pad is connected to the touch electrode when the bonding area is arranged on the first transparent substrate, and the second bonding pad is connected to the display electrode when the bonding area is arranged on the second transparent substrate;

forming a via hole in the first transparent substrate;

connecting a remaining bonding pad and a remaining electrode through the via hole, wherein the remaining bonding pad is the second bonding pad and the remaining electrode is the display electrode when the bonding area is arranged on the first transparent substrate; the remaining bonding pad is the first bonding pad, and the remaining electrode is the touch electrode when the bonding area is arranged on the second transparent substrate; and bonding the first and second bonding pads to a flexible printed circuit simultaneously.

In an implementation of the embodiments of the present disclosure, forming the via hole in the first transparent substrate includes:

forming the via hole in the first transparent substrate by laser drilling.

In another implementation of the embodiments of the present disclosure, connecting the remaining bonding pad and the remaining electrode through the via hole includes:

injecting conductive film into the via hole to connect the remaining bonding pad and the remaining electrode.

In another implementation of the embodiments of the present disclosure, the conductive film is silver colloid.

In another implementation of the embodiments of the present disclosure, bonding the first and second bonding pads to a flexible printed circuit simultaneously includes:

coated the bonding area with anisotropic conductive film (ACP); and bonding the first and second bonding pads to the flexible printed circuit simultaneously in an aligned manner through the anisotropic conductive film.

In another implementation of the embodiments of the present disclosure, the first and second bonding pads are bonded to two flexible printed circuits respectively.

In another implementation of the embodiments of the present disclosure, the first and second bonding pads are bonded to the same flexible printed circuit.

The technical solutions provided by the present disclosure may include the following advantageous benefits:

The first and second bonding pads are arranged in the bonding area of the first or second transparent substrate and are connected to the touch electrode and the display electrode, respectively. As the first and second bonding pads are located on the same transparent substrate, they can be bonded to an FPC simultaneously without performing bonding twice, thereby reducing the bonding times, and saving time and labor. Meanwhile, as the first and second bonding pads are located on the same transparent substrate, the FPC bonded to the bonding pad of the touch electrode does not need to cross the layer to connect the bonding pad and the PCB, thereby solving the problem of the low mass production yield.

BRIEF DESCRIPTION OF THE DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DETAILED DESCRIPTION

The present disclosure will be described in further detail with reference to the enclosed drawings, to clearly present the objects, technique solutions, and advantages of the present disclosure.

Figure 1:
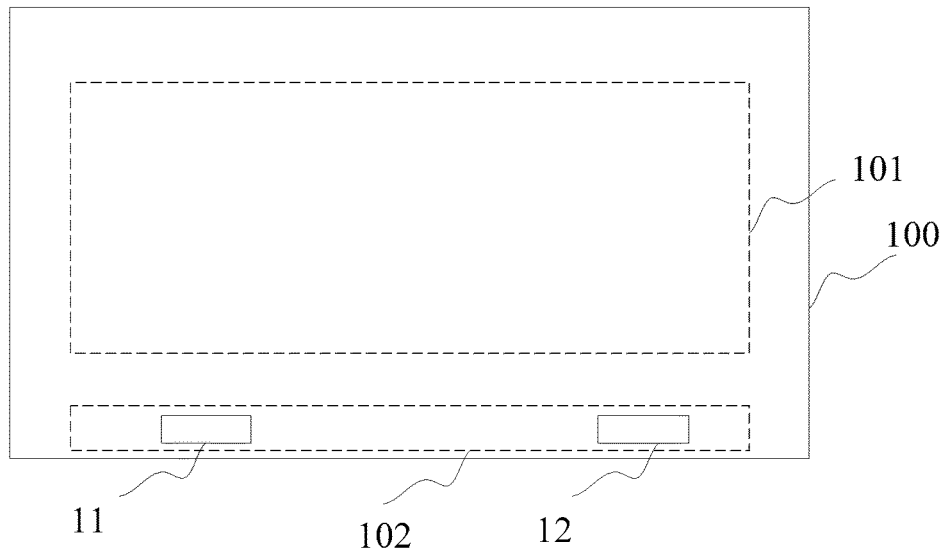
FIG. 1 is a structural schematic diagram of a display substrate provided in an embodiment of the present disclosure.

FIG. 1 is a structural schematic diagram of a display substrate provided in an embodiment of the present disclosure. Referring to FIG. 1, the display substrate includes: a transparent substrate 100 that includes a display area 101 and a bonding area 102 located at the periphery of the display area.

The bonding area 102 is provided with a first bonding pad 11 connected with a touch electrode, and a second bonding pad 12 connected with a display electrode. One of the touch electrode and the display electrode is located in the display area 101, and the other electrode is located on another transparent substrate 100 that faces to the transparent substrate 100.

In the display panel, the first and second bonding pads are arranged in the bonding area of the first or second transparent substrate and are connected to the touch electrode and the display electrode, respectively. As the first and second bonding pads are located on the same transparent substrate, they can be bonded to an FPC simultaneously without performing bonding twice, thereby reducing the bonding times, and saving time and labor. Meanwhile, as the first and second bonding pads are located on the same transparent substrate, the FPC bonded to the bonding pad of the touch electrode does not need to cross the layer to connect the bonding pad and the PCB, thereby solving the problem of the low mass production yield.

The touch electrode is arranged on the surface of the transparent substrate 100 back onto the other transparent substrate. Alternatively, the display electrode is arranged on the surface of the transparent substrate 100 facing the other transparent substrate. The touch electrode is arranged on the surface of the transparent substrate 100 back onto the other transparent substrate, while the display electrode is located on the other transparent substrate. Alternatively, the display electrode is arranged on the surface of the transparent substrate 100 facing the other transparent substrate, while the touch electrode is located on the other transparent substrate. It can be seen that the touch electrode and the display electrode are arranged on two different transparent substrates, respectively, and the display substrate is applied to an on-cell touch display panel.

In the embodiments of the present disclosure, the number of the first bonding pad(s) 11 may be set in accordance with the number of the touch electrode(s), and the number of the second bonding pad(s) 12 may be set in accordance with the number of the display electrode(s).

In the embodiments of the disclosure, the display substrate may be an array substrate or a color filter substrate of a liquid crystal display (LCD), and may also be an array substrate or an upper transparent substrate (cover plate) of an organic light-emitting diode (OLED) display.

In the liquid crystal display, it is necessary to form a via hole in the color filter substrate no matter whether the bonding area is arranged on the array substrate or the color filter substrate, so as to connect the bonding pad and the electrode located on different transparent substrates with respect to the bonding area. In the OLED display, it is necessary to form a via hole in the upper transparent substrate of the OLED display no matter whether the bonding area is arranged on the array substrate or the upper transparent substrate of the OLED display, so as to connect the bonding pad and the electrode located on different transparent substrates with respect to the bonding area.

In a possible implementation, the display substrate is an array substrate of a LCD or an OLED display, and the display electrode is arranged on the transparent substrate. Here, the touch electrode is located on a transparent substrate of the color filter substrate of the LCD or the upper transparent substrate of the OLED display. As the number of the bonding pads of the display electrode on the array substrate is greater than that of the bonding pads of the touch electrodes, that is, the number of the first bonding pads connected to the display electrodes is greater than that of the second bonding pads connected to the touch electrodes, and the number of the via holes is equal to that of the bonding pads need to be connected, the number of the via holes to be formed can be reduced by arranging the bonding area on the array substrate.

In another possible implementation, the display substrate is a color filter substrate. A via hole is further formed in the color filter substrate and configured to connect the display electrode and the second bonding pad. When the bonding area is arranged on the color filter substrate, it is necessary to connect the display electrode to the second bonding pad of the bonding area through the via hole.

Similar to the color filter substrate, it is also necessary to form a via hole in the upper transparent substrate of the OLED display when the display substrate is the upper transparent substrate of the OLED display. The via hole is configured to connect the display electrode and the second bonding pad.

Figure 2A:
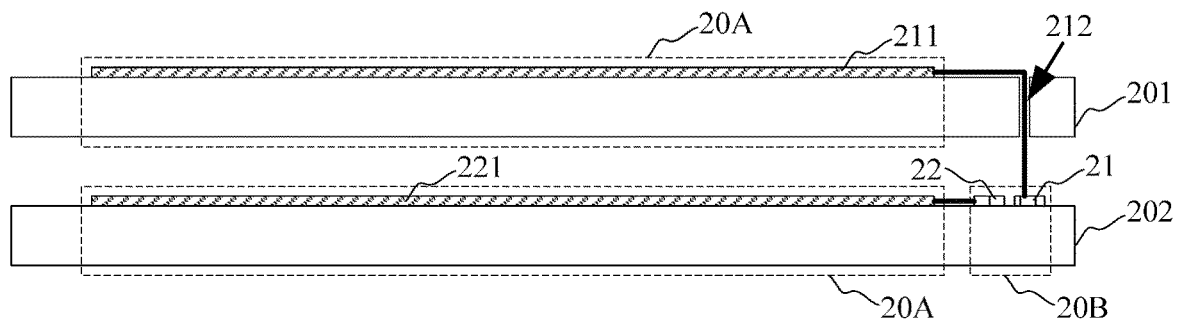
FIGS. 2A and 2B are structural schematic diagrams of display panels provided in embodiments of the present disclosure.
Figure 2B:
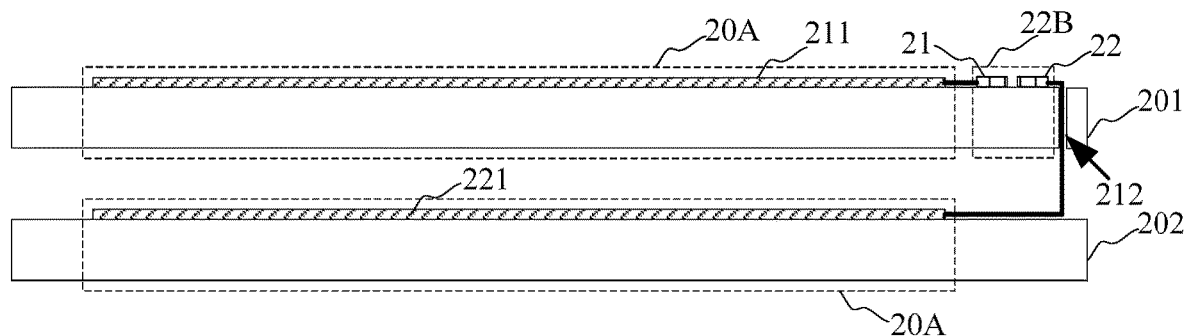

FIGS. 2A and 2B show schematic structural views of two display panels provided by the embodiments of the disclosure. Referring to FIGS. 2A and 2B, the display panel comprises a first transparent substrate 201 and a second transparent substrate 202 facing to each other. The transparent substrate 201 is located at the light-emitting side of the display panel. Each of the first transparent substrate 201 and the second transparent substrate 202 comprises a display area 20A. A touch electrode 211 is arranged in the display area 20A of the first transparent substrate 201. A display electrode 221 is arranged in the display area 20A of the second transparent substrate 202.

A via hole 212 is formed in the first transparent substrate 201. The first transparent substrate 201 or the second transparent substrate 202 is also provided with a bonding area 20B located at the periphery of the display area 20A. The bonding area 20B shown in FIG. 2A is located on the second transparent substrate 202. The bonding area 20B shown in FIG. 2B is located on first transparent substrate 201. A first bonding pad 21 connected to the touch electrode 211 and a second bonding pad 22 connected to the display electrode 221 are arranged in the bonding area 20B. When the bonding area 20B is located on the first transparent substrate 201, the via hole 212 is configured to connect the second bonding pad 22 and the display electrode 221. Alternatively, when the bonding area 20B is located on the second transparent substrate 202, the via hole 212 is configured to connect the first bonding pad 21 and the touch electrode 211.

Specifically, the touch electrode 211 is arranged in the display area 20A on the surface of the first transparent substrate 201 back onto the second transparent substrate 202. The display electrode 221 is arranged in the display area 20A on the surface of the second transparent substrate 202 facing the first transparent substrate 201.

FIGS. 2A and 2B are merely schematic views. On one hand, during practical fabrication, the first bonding pad 21 and the second bonding pad 22 are generally arranged side by side, and a connection line of the first and second bonding pads is parallel to the side of the transparent substrate close to the bonding pads on this substrate (shown in FIGS. 3A and 3B). On the other hand, each of the touch electrode 211 and the display electrode 221 comprises a plurality of electrodes. In a LCD, the display electrode 221 comprises a gate electrode and a source drain electrode which are layered. In an OLED display, the display electrode comprises an anode and a cathode which are layered.

In the display panel, the first and second bonding pads are arranged in the bonding area of the first or second transparent substrate and are connected to the touch electrode and the display electrode, respectively. As the first and second bonding pads are located on the same transparent substrate, they can be bonded to an FPC simultaneously without performing bonding twice, thereby reducing the bonding times, and saving time and labor. Meanwhile, as the first and second bonding pads are located on the same transparent substrate, the FPC bonded to the bonding pad of the touch electrode does not need to cross the layer to connect the bonding pad and the PCB, thereby solving the problem of the low mass production yield.

In the embodiment of the present disclosure, the via hole 212 may be formed after the sealant is manufactured since it's formed at the periphery of the sealant of the display panel. Further, in the LCD, the via hole is formed after the touch electrode and the polarizer are manufactured.

In the embodiment of the present disclosure, each of the touch electrode and the display electrode comprises a lead, and the touch electrode or the display electrode is connected to the bonding pad through the lead or through the lead and the via hole.

Figure 3A:
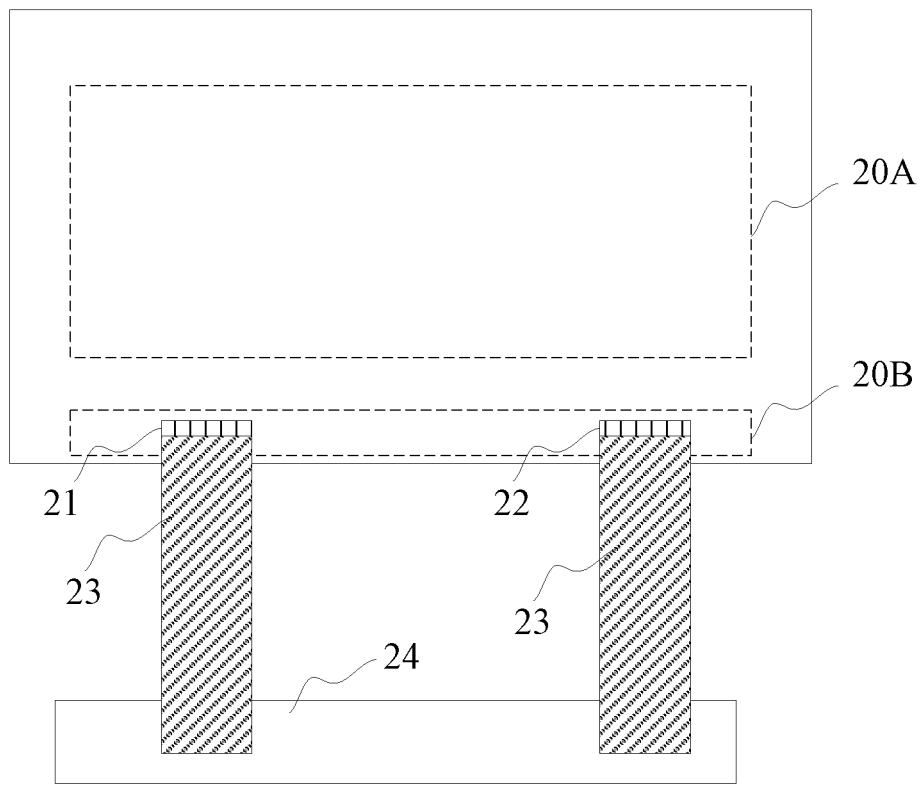
FIG. 3A is a top view of a first transparent substrate provided in an embodiment of the present disclosure.
Figure 3B:
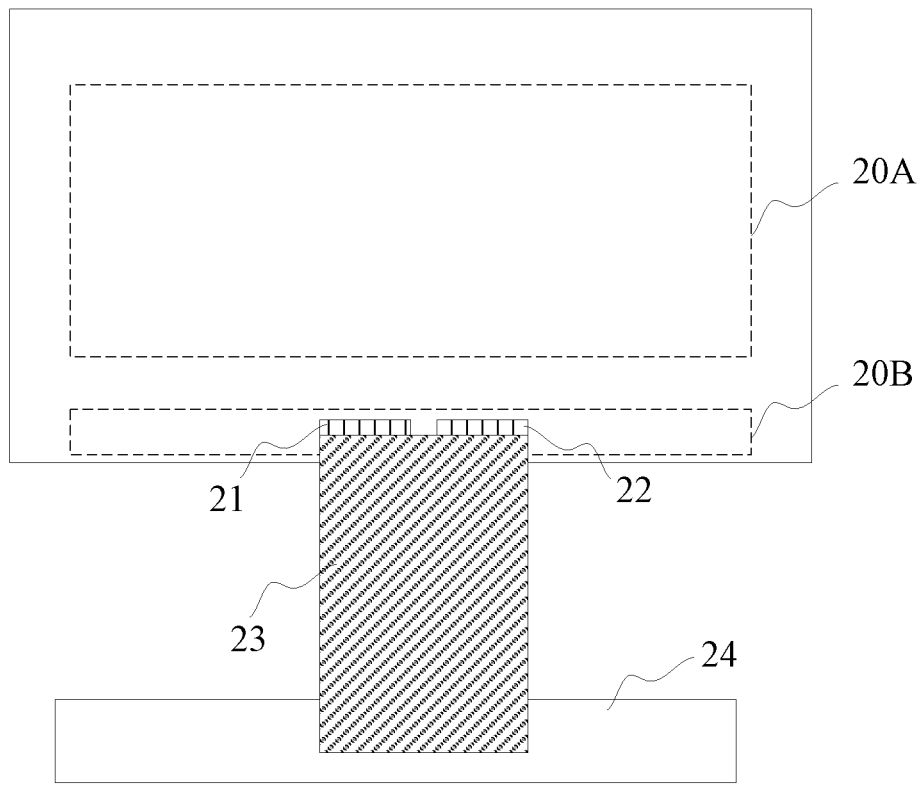
FIG. 3B is a top view of a second transparent substrate provided in an embodiment of the present disclosure.

FIG. 3A is a top view of a first transparent substrate provided by an embodiment of the disclosure, and FIG. 3B is a top view of a second transparent substrate provided by an embodiment of the disclosure. Referring to FIG. 3A, in a possible implementation, the first bonding pad 21 is connected to the PCB 24 through one of two FPCs 23, and the second bonding pad 22 is connected to the PCB 24 through the other FPC 23. FPCs in the prior art can be adopted when two FPCs are used for bonding.

In some embodiments, a plurality of first bonding pads 21 and a plurality of second bonding pads 22 may be arranged in the bonding area (FIG. 3A only shows one first bonding pad 21 and one second bonding pad 22). The plurality of first bonding pads 21 may be connected to the PCB 24 through a FPC 23, and the plurality of second bonding pads 22 may be connected to the PCB 24 through another FPC 23. In this case, the distance between a side for the plurality of first bonding pads 21 and a side for the plurality of second bonding pads 22 that is adjacent to the side for the plurality of first bonding pads may be greater than 100 micrometers. The two FPCs 23 and the PCB 24 may be integrated into one piece.

Referring to FIG. 3B, in a possible implementation, the first bonding pad 21 and the second bonding pad 22 are connected to the PCB 24 through the same FPC 23. By using one FPC for bonding, the bonding procedure is simplified, the crimping possibility of a feed material is reduced, and the mass production yield is increased. In this implementation, the distance between the first bonding pad 21 and the second bonding pad 22 is less than a predetermined value, so that the bonding can be realized through one FPC.

In some embodiments, a plurality of first bonding pads 21 and a plurality of second bonding pads 22 may be arranged in the bonding area (FIG. 3B only shows one first bonding pad 21 and one second bonding pad 22). The plurality of first bonding pads 21 and the plurality of second bonding pads 22 may be connected to the PCB 24 through the same FPC 23. In this case, the distance between a side for the plurality of first bonding pads 21 and a side for the plurality of second bonding pads 22 that is adjacent to the side for the plurality of first bonding pads may be greater than or equal to 100 micrometers and less than or equal to 100 millimeters. The two FPCs 23 and the PCB 24 may be integrated into one piece.

The embodiments of the present disclosure further provide a display device. The display device includes the display panel shown in any of FIG. 2A to FIG. 3B.

In the detailed implementation, the display device of the embodiments of the present disclosure can be a mobile phone, a tablet, a TV, a display, a laptop computer, a digital phone frame, a GPS, or any other products or parts with display functionality. For example, the display device may be a LCD or an OLED display.

In the display device, the first and second bonding pads are arranged in the bonding area of the first or second transparent substrate and are connected to the touch electrode and the display electrode, respectively. As the first and second bonding pads are located on the same transparent substrate, they can be bonded to an FPC simultaneously without performing bonding twice, thereby reducing the bonding times, and saving time and labor. Meanwhile, as the first and second bonding pads are located on the same transparent substrate, the FPC bonded to the bonding pad of the touch electrode does not need to cross the layer to connect the bonding pad and the PCB, thereby solving the problem of the low mass production yield.

Figure 4:
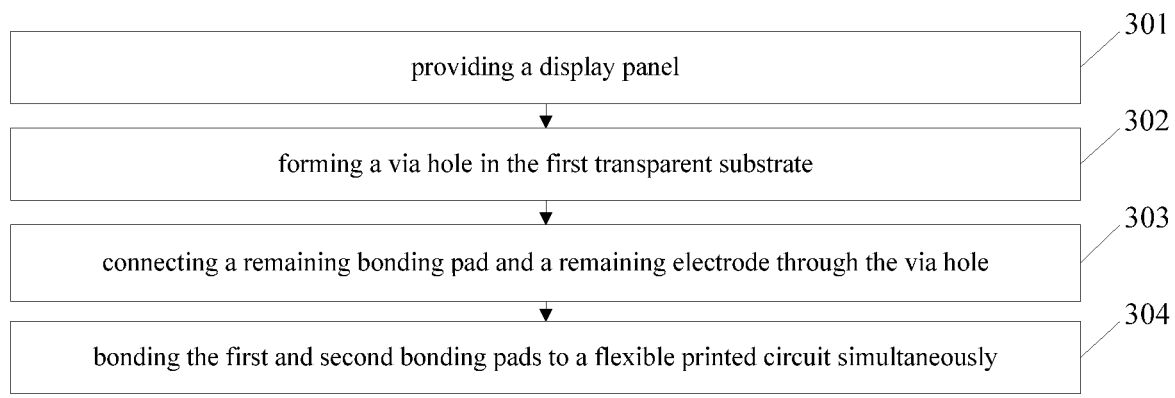
FIG. 4 is a flow chart of a bonding method provided in an embodiment of the present disclosure.

FIG. 4 shows a flow chart of a bonding method provided by the embodiments of the present disclosure. Referring to FIG. 4, the method includes following steps.

In step 301: a display panel is provided.

Figure 5A:
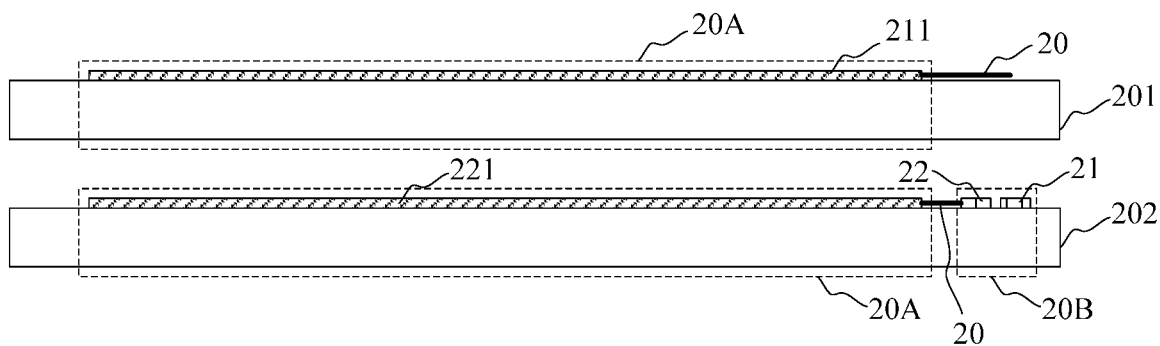
FIGS. 5A and 5B are structural schematic diagrams of display panels during a bonding process.
Figure 5B:
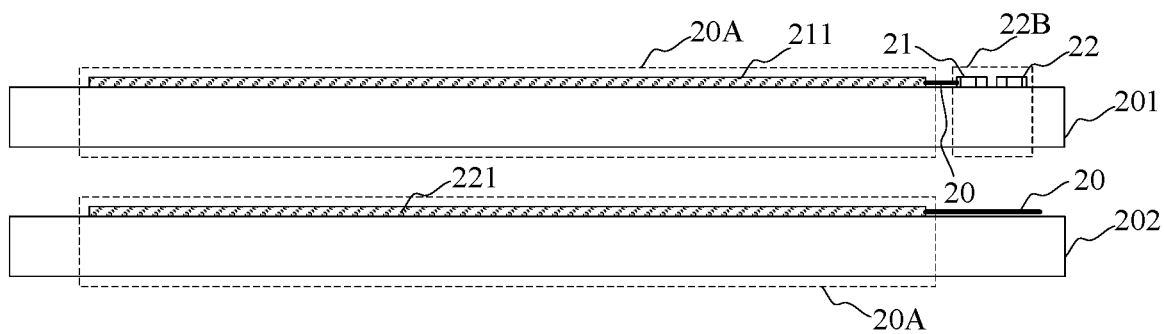

FIGS. 5A and 5B show structural schematic diagrams of two kinds of display panels provided in step 301. The display panel includes a first transparent substrate 201 and a second transparent substrate 202 facing each other. The first transparent substrate 201 is located at the light-emitting side of the display panel. Each of the first transparent substrate 201 and the second transparent substrate 202 includes a display area 20A. A touch electrode 211 is arranged in the display area 20A of the first transparent substrate 201, and a display electrode 221 is arranged in the display area 20A of the second transparent substrate 202.

The first transparent substrate 201 or the second transparent substrate 202 is further provided with a bonding area 20B located at the periphery of the display area 20A. The bonding area 20B shown in FIG. 5A is located on the second transparent substrate 202, and the bonding area 20B shown in FIG. 5B is located on the first transparent substrate 201. A first bonding pad 21 and a second bonding pad 22 are arranged in the bonding area 20B.

Specifically, the touch electrode 211 is arranged in the display area 20A on the surface of the first transparent substrate 201 back onto the second transparent substrate 202. The display electrode 221 is arranged in the display area 20A on the surface of the second transparent substrate 202 facing the first transparent substrate 201.

As shown in FIGS. 5A and 5B, the display panel further includes a lead 20 for connecting the touch electrode 211 and the display electrode 221. The touch electrode 211 or the display electrode 221 may be connected to the bonding pad through the lead 20. As shown in FIG. 5A, a bonding area 20B is arranged on the second transparent substrate 202, and the display electrode 221 is connected to the second bonding pad 22 through the lead 20. In this case, the remaining first bonding pad 21 (here, the first bonding pad 21 is the remaining bonding pad) and the touch electrode 211 (here, the touch electrode is the remaining electrode) are not connected. As shown in FIG. 5B, the bonding area 20B is arranged on the first transparent substrate 201, and the touch electrode 211 is connected to the first bonding pad 21 through the lead 20. In this case, the remaining second bonding pad 22 (here, the second bonding pad 22 is the remaining bonding pad) and the display electrode 221 (here, the display electrode is the remaining electrode) are not connected.

In step 302, a via hole is formed in the first transparent substrate.

In the embodiments of the present disclosure, step 302 may comprise: forming the via hole in the first transparent substrate by laser drilling. Thus, the via hole is formed in the first transparent substrate simply and conveniently.

Figure 6A:
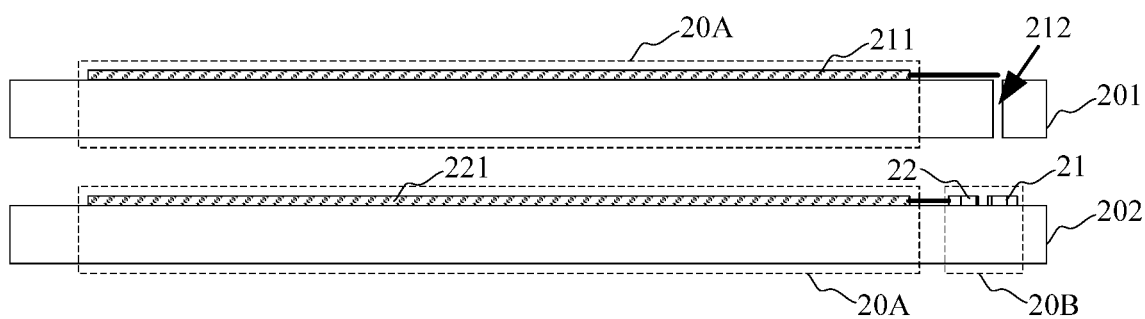
FIGS. 6A and 6B are structural schematic diagrams of display panels during a bonding process.
Figure 6B:
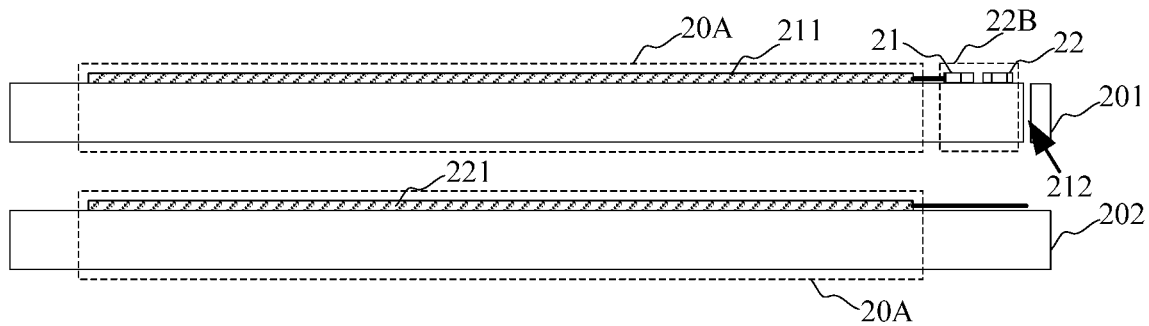

After the via hole is formed in the display panel shown in FIG. 5A, the structure is as shown in FIG. 6A. The first transparent substrate 201 is provided with the via hole 212. After the via hole is formed in the display panel shown in FIG. 5B, the structure is as shown in FIG. 6B. The first transparent substrate 201 is provided with the via hole 212.

Further, the via hole 212 is formed at the end where the lead 20 extends to facilitate subsequent connection between the electrode and the bonding pad.

In step 303, the remaining bonding pad and the remaining electrode are connected through the via hole.

In step 303, the remaining bonding pad in the first bonding pad 21 and in the second bonding pad 22 may be connected to the remaining electrode through the via hole. As shown in FIG. 6A, when the bonding area 20B is located on the second transparent substrate 202, the via hole 212 may be located on the first transparent substrate 201. In step 303, the first bonding pad 21 (the remaining bonding pad) and the touch electrode 211 (the remaining electrode) may be connected through the via hole 212. As shown in FIG. 6B, when the bonding area 20B is located on the first transparent substrate 201, the via hole 212 may be located on the first transparent substrate 201. In step 303, the second bonding pad 22 (the remaining bonding pad) and the display electrode 221 (the remaining electrode) may be connected through the via hole 212.

In the embodiments of the present disclosure, step 303 may comprise the following step.

Conductive film is injected into the via hole to connect the second bonding pad and the display electrode or connect the first bonding pad and the touch electrode. The via hole connection is convenient by using the conductive film. In some embodiments, the conductive film may be silver colloid.

The conductive film is injected into the via hole 212 to form a circuit to connect the first bonding pad 21 and the touch electrode 211 (see FIG. 2A) or connect the second bonding pad 22 and the display electrode 221 (see FIG. 2B). Specifically, the circuit formed by the conductive film is the lead 20 for connecting the first bonding pad 21 and the touch electrode 211, or the lead 20 for connecting the second bonding pad 22 and the display electrode 221.

In step 304, the first bonding pad and the second bonding pad are bonded to the FPC simultaneously.

In the embodiments of the present disclosure, step 304 may comprise the following step.

The bonding area is coated with anisotropic conductive film (ACF), and the first and second bonding pads are bonded to the FPC simultaneously in an aligned manner through the ACF.

In the embodiments of the present disclosure, as the first and second bonding pads are arranged on the same transparent substrate, they can be bonded to the FPC simultaneously so as to solve the problem of multiple times of bonding.

In an implementation of the embodiments of the present disclosure, the first bonding pad and the second bonding pad may be bonded to two FPCs, respectively, which may be referred to FIG. 3A. Therefore, FPCs in the prior art can be adopted when two FPCs are used for bonding.

In another implementation of the embodiments of the present disclosure, the first and second bonding pads are bonded to the same FPC, which may be referred to FIG. 3B. By using one FPC for bonding, the bonding procedure is simplified, the crimping possibility of a feed material of the FPC is reduced, and the mass production yield is increased.

In the display panel, the first and second bonding pads are arranged in the bonding area of the first or second transparent substrate and are connected to the touch electrode and the display electrode, respectively. As the first and second bonding pads are located on the same transparent substrate, they can be bonded to an FPC simultaneously without performing bonding twice, thereby reducing the bonding times, and saving time and labor. Meanwhile, as the first and second bonding pads are located on the same transparent substrate, the FPC bonded to the bonding pad of the touch electrode does not need to cross the layer to connect the bonding pad and the PCB, thereby solving the problem of the low mass production yield.

The foregoing are only some embodiments of the present disclosure, and are not intended to limit the present disclosure. Within the spirit and principles of the disclosure, any modifications, equivalent substitutions, improvements, etc., are within the scope of protection of the present disclosure.

What is claimed is:

1. A display substrate, comprising: a transparent substrate comprising a display area and a bonding area located at the periphery of the display area, wherein
   the bonding area is provided with a first bonding pad connected with a touch electrode through a lead, and a second bonding pad connected with a display electrode; and
   the touch electrode is located in the display area, and the display electrode is located on another transparent substrate facing the transparent substrate,
   wherein the display substrate is a color filter substrate; and a via hole is further formed in the transparent substrate, and is configured to connect the display electrode and the second bonding pad, and
   wherein the first bonding pad and the touch electrode are located on a same surface of the transparent substrate.

2. The display substrate according to claim 1, wherein the second bonding pad and the via hole are spaced apart from each other.

3. A display panel, comprising: a first transparent substrate and a second transparent substrate facing each other, wherein the first transparent substrate is located at a light-emitting side of the display panel; each of the first and second transparent substrates comprises a display area; a touch electrode is arranged in the display area of the first transparent substrate; a display electrode is arranged in the display area of the second transparent substrate;
   a via hole is formed in the first transparent substrate;
   wherein,
      the first transparent substrate is further provided with a bonding area located at the periphery of the display area, wherein a first bonding pad is connected to the touch electrode through a lead, a second bonding pad is connected to the display electrode, and both bonding pads are arranged in the bonding area; the via hole is configured to connect the second bonding pad and the display electrode, and the first bonding pad and the touch electrode are located on a same surface of the first transparent substrate;

or, the second transparent substrate is further provided with a bonding area located at the periphery of the display area, wherein a first bonding pad is connected to the touch electrode, a second bonding pad is connected to the display electrode, and both bonding pads are arranged in the bonding area; and the via hole is configured to connect the first bonding pad and the touch electrode.

4. The display panel according to claim 3, further comprising: a printed circuit board and two flexible printed circuits, wherein the first bonding pad is connected to the printed circuit board through one of the two flexible printed circuits; and the second bonding pad is connected to the printed circuit board through the other one of the two flexible printed circuits.

5. A display device, comprising the display panel according to claim 4.

6. The display panel according to claim 3, further comprising: a printed circuit board and a flexible printed circuit, wherein the first bonding pad and the second bonding pad are connected to the printed circuit board through the same flexible printed circuit.

7. A display device, comprising the display panel according to claim 6.

8. A display device, comprising the display panel according to claim 3.

9. The display panel according to claim 3, wherein the second bonding pad and the via hole are spaced apart from each other.

10. The display panel according to claim 3, wherein when the bonding area is arranged on the first transparent substrate, the first bonding pad, the second bonding pad and the touch electrode are located on the same surface of the first transparent substrate; or when the bonding area is arranged on the second transparent substrate, the first bonding pad, the second bonding pad and the display electrode are located on the same surface of the second transparent substrate.

11. The display panel according to claim 3, wherein when the bonding area is arranged on the first transparent substrate, the first bonding pad, the second bonding pad and the touch electrode are located on the same surface of the first transparent substrate distal from the second transparent substrate; or when the bonding area is arranged on the second transparent substrate, the first bonding pad, the second bonding pad and the display electrode are located on the same surface of the second transparent substrate facing the first transparent substrate.

12. A bonding method, comprising:

providing a display panel comprising a first transparent substrate and a second transparent substrate facing each other, wherein the first transparent substrate is located at the light-emitting side of the display panel; each of the first and second transparent substrates comprises a display area; a touch electrode is arranged in the display area of the first transparent substrate; a display electrode is arranged in the display area of the second transparent substrate;

wherein, the first transparent substrate is further provided with a bonding area located at the periphery of the display area, wherein a first bonding pad and a second bonding pad are arranged in the bonding area; the first bonding pad is connected to the touch electrode through a lead, the second bonding pad is connected to the display electrode, and the first bonding pad and the touch electrode are located on a same surface of the first transparent substrate; the method further comprises:

forming a via hole in the first transparent substrate;

connecting the second bonding pad and the display electrode through the via hole; and bonding the first and second bonding pads to a flexible printed circuit simultaneously, or, the second transparent substrate is further provided with a bonding area located at the periphery of the display area; a first bonding pad and a second bonding pad are arranged in the bonding area, the first bonding pad is connected to the touch electrode, the second bonding pad is connected to the display electrode; the method further comprises:

forming a via hole in the first transparent substrate;

connecting the first bonding pad and the touch electrode through the via hole;

bonding the first and the second bonding pads to a flexible printed circuit simultaneously.

13. The method according to claim 12, wherein connecting the remaining bonding pad and the remaining electrode through the via hole comprises:

injecting conductive film into the via hole to connect the remaining bonding pad and the remaining electrode.

14. The method according to claim 13, wherein the first bonding pad and the second bonding pad are bonded to two flexible printed circuits, respectively; or the first bonding pad and the second bonding pad are bonded to the same flexible printed circuit.

15. The method according to claim 12, wherein the first bonding pad and the second bonding pad are bonded to two flexible printed circuits; or the first bonding pad and the second bonding pad are bonded to the same flexible printed circuit.

16. The method according to claim 12, wherein the second bonding pad and the via hole are spaced apart from each other.

17. The method according to claim 12, wherein when the bonding area is arranged on the first transparent substrate, the first bonding pad, the second bonding pad and the touch electrode are located on the same surface of the first transparent substrate; or when the bonding area is arranged on the second transparent substrate, the first bonding pad, the second bonding pad and the display electrode are located on the same surface of the second transparent substrate.

18. The method according to claim 12, wherein when the bonding area is arranged on the first transparent substrate, the first bonding pad, the second bonding pad and the touch electrode are located on the same surface of the first transparent substrate distal from the second transparent substrate; or when the bonding area is arranged on the second transparent substrate, the first bonding pad, the second bonding pad and the display electrode are located on the same surface of the second transparent substrate facing the first transparent substrate.

* * * * *